(12) United States Patent
Sano

(10) Patent No.: US 11,290,057 B2
(45) Date of Patent: Mar. 29, 2022

(54) OSCILLATION CIRCUIT

(71) Applicant: ABLIC Inc., Tokyo (JP)

(72) Inventor: Minoru Sano, Tokyo (JP)

(73) Assignee: ABLIC INC., Tokyo (JP)

( * ) Notice: Subject to any disclaimer, the term of this patent is extended or adjusted under 35 U.S.C. 154(b) by 0 days.

(21) Appl. No.: 17/092,604

(22) Filed: Nov. 9, 2020

(65) Prior Publication Data

US 2021/0159853 A1    May 27, 2021

(30) Foreign Application Priority Data

Nov. 22, 2019   (JP) .............................. JP2019-211617

(51) Int. Cl.
| | |
|---|---|
| *H03B 5/12* | (2006.01) |
| *H03B 5/24* | (2006.01) |
| *H03B 5/06* | (2006.01) |
| *H03K 5/24* | (2006.01) |
| *H03K 3/037* | (2006.01) |

(52) U.S. Cl.
CPC .............. *H03B 5/06* (2013.01); *H03K 3/037* (2013.01); *H03K 5/24* (2013.01)

(58) Field of Classification Search
CPC . H03B 5/06; H03K 5/24; H03K 3/037; H03K 3/0231
USPC ...................................................... 331/108 R
See application file for complete search history.

(56) References Cited

U.S. PATENT DOCUMENTS

| | | | | |
|---|---|---|---|---|
| 7,034,627 B1* | 4/2006 | Kudari | ................... | H03K 3/011 331/111 |
| 8,878,621 B2* | 11/2014 | Matsuzaki | ................ | H03L 1/04 331/176 |
| 2002/0084850 A1* | 7/2002 | Otaka | ....................... | H03G 1/04 330/254 |
| 2012/0319793 A1 | 12/2012 | Iwasa | | |
| 2017/0104475 A1* | 4/2017 | Lam | ......................... | H03B 5/24 |
| 2018/0143660 A1* | 5/2018 | Huang | .................... | G05F 3/267 |

FOREIGN PATENT DOCUMENTS

JP                2013-005109 A         1/2013

* cited by examiner

*Primary Examiner* — Richard Tan
(74) *Attorney, Agent, or Firm* — Crowell & Moring LLP

(57) ABSTRACT

Provided is an oscillation circuit including: a first current source circuit; a second current source circuit; a resistor between the output terminal of the first current source circuit and a second power source; a first capacitor; a second capacitor; a first comparator circuit having a first input terminal to which is a voltage across the resistor is applied as a reference voltage and a second input terminal to which a voltage of the first capacitor is applied; a second comparator circuit having a first input terminal to which is the reference voltage is applied and a second input terminal to which a voltage of the second capacitor is applied; an RS latch; a first and a second switches switching a destination, of an current supplied from the second current source circuit, selected from the first and the second capacitors.

8 Claims, 9 Drawing Sheets

OSCILLATION CIRCUIT

RELATED APPLICATIONS

This application claims priority to Japanese Patent Application No. 2019-211617, filed on Nov. 22, 2019, the entire content of which is incorporated herein by reference.

BACKGROUND OF THE INVENTION

1. Field of the Invention

The present invention relates to an oscillation circuit.

2. Description of the Related Art

Hitherto, relaxation oscillation circuits have been known as oscillation circuits with no quartz oscillator. FIG. 9 is a circuit diagram of a relaxation oscillation circuit 801. The relaxation oscillation circuit 801 is an example of a conventional oscillation circuit and includes a CR oscillation circuit 802, a band-gap reference circuit 803, and a voltage-current conversion circuit 804. The CR oscillation circuit 802 includes a resistor RV, capacitors C1 and C2, inverters INV1 and INV2, and a comparator COMP. The relaxation oscillation circuit has an oscillation frequency which is determined by the comparator COMP comparing a reference voltage Vref and voltages of the capacitors C1 and C2 charged through the resistor RV connected to an output terminal of the inverter INV1.

The band-gap reference circuit 803 is configured to supply a reference voltage which is not dependent on the temperature to the voltage-current conversion circuit 804. The voltage-current conversion circuit 804 is configured to convert the voltage supplied from the band-gap reference circuit 803 into a current, and then supply a bias current to the comparator COMP. The comparator COMP is controlled in its response speed in accordance with an amount of the supplied bias current.

SUMMARY OF THE INVENTION

The conventional oscillation circuit described above has still scope for improvement, and thus it is an object of the present invention to provide an oscillation circuit which suppresses a power consumption.

According to at least one embodiment of the present invention, there is provided an oscillation circuit including: a first current source circuit having a power supply terminal to be connected to a first power source and an output terminal; a second current source circuit having a power supply terminal to be connected to the first power source and an output terminal; a resistor between the output terminal of the first current source circuit and a second power source; a first capacitor; a second capacitor; a first comparator circuit having a first input terminal to which is a voltage across the resistor is applied as a reference voltage and a second input terminal to which a voltage of the first capacitor is applied; a second comparator circuit having a first input terminal to which is the reference voltage is applied and a second input terminal to which a voltage of the second capacitor is applied; and an RS latch configured to receive a first output signal supplied from the first comparator circuit and a second output signal supplied from the second comparator circuit, and output signal at a High level or a Low level; a first switch is configured to connect or disconnect a current path between the second current source circuit and the first capacitor in accordance with a signal level of the output signal of the RS latch; and a second switch is configured to disconnect or connect a current path between the second current source circuit and the second capacitor in accordance with the signal level of the output signal of the RS latch.

With the oscillation circuit according to at least one embodiment of the present invention, a low power consumption can be achieved.

DETAILED DESCRIPTION OF THE PREFERRED EMBODIMENTS

First Embodiment

Figure 1:
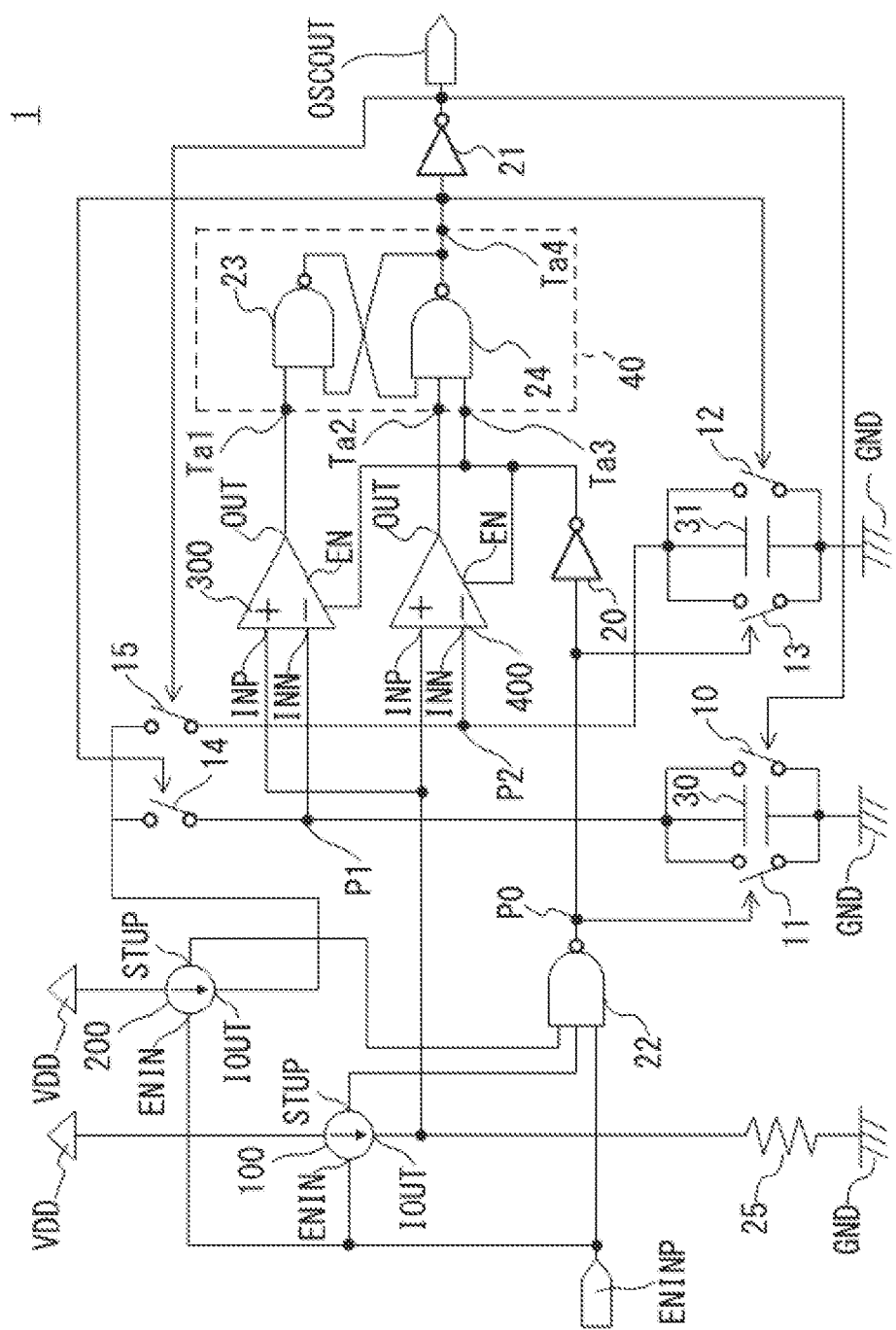
FIG. 1 is a circuit diagram of an oscillation circuit according to a first embodiment of the present invention.

FIG. 1 is a circuit diagram of an oscillation circuit 1. The oscillation circuit 1 is an example of the oscillation circuit according to a first embodiment of the present invention and includes an enable signal input terminal ENINP, an output terminal OSCOUT, switches 10 to 15, inverters 20 and 21, a 3-input NAND circuit 22, a resistor 25, capacitors 30 and 31, an RS latch 40, current source circuits 100 and 200, and comparator circuits 300 and 400. The switches 10 to 15 switches between an on (a connected) state and an off (a disconnected) state in accordance with a level of a control signal applied at a control terminal. In this example, if the level of the applied control signal is a High level, the switches 10 to 15 are each turned on. If the level of the applied control signal is a Low level, the switches 10 to 15 are each. The current source circuits 100 and 200 each include a power supply terminal, an output terminal IOUT, an enable signal input terminal ENIN, and a start-up signal output terminal STUP. The comparator circuits 300 and 400 each include a non-inverting input terminal INP, an inverting input terminal INN, an output terminal OUT, and an enable signal input terminal EN. The RS latch 40 includes a 2-input NAND circuit 23 and a 3-input NAND circuit 24, and have three input terminals Ta1, Ta2, and Ta3 and one output terminal Ta4. Here, description about some connections to a power supply VDD and a power supply GND is omitted.

The current source circuit 100 has the power supply terminal connected to the power supply VDD, the output terminal IOUT connected to the power supply GND via the resistor 25, and the enable signal input terminal ENIN connected to the enable signal input terminal ENINP. The current source circuit 200 has the power supply terminal connected to the power supply VDD, and has the output terminal IOUT which is connected to the power supply GND via the switch 14 and the capacitor 30 and is connected to the power supply GND via the switch 15 and the capacitor 31.

In the comparator circuit 300, the non-inverting input terminal INP is connected to the output terminal IOUT of the current source circuit 100, and the inverting input terminal INN is connected to a connection point P1 between the switch 14 and the capacitor 30. In response to receiving a voltage which is higher than a voltage applied to the non-inverting input terminal INP at the inverting input terminal INN, the comparator circuit 300 supplies a Low-level voltage from the output terminal OUT. Meanwhile, in response to receiving a voltage lower than the voltage applied to the non-inverting input terminal INP at the inverting input terminal INN, the comparator circuit 300 supplies a High-level voltage from the output terminal OUT.

In the comparator circuit 400, the non-inverting input terminal INP is connected to the output terminal IOUT of the current source circuit 100, and the inverting input terminal INN is connected to a connection point P2 between the switch 15 and the capacitor 31. In the same way as in the comparator circuit 300, in response to receiving a voltage which is higher than a voltage applied to the non-inverting input terminal INP at the inverting input terminal INN, the comparator circuit 400 supplies a Low-level voltage from the output terminal OUT. Meanwhile, in response to receiving a voltage which is lower than a voltage applied to the non-inverting input terminal INP at the inverting input terminal INN, the comparator circuit 400 supplies a High-level voltage from the output terminal OUT.

The comparator circuit 300 has the output terminal OUT connected to the input terminal Ta1. The comparator circuit 400 has the output terminal OUT connected to the input terminal Ta2. The output terminal Ta4 is connected to the control terminal of the switch 12, the control terminal of the switch 11, and an input terminal of the inverter 21. The inverter 21 has an output terminal connected to the control terminal of the switch 10, the control terminal of the switch 15, and the output terminal OSCOUT.

Internal connections of the RS latch 40 are described. The input terminal Ta1 is connected to a first input terminal of the 2-input NAND circuit 23. The 2-input NAND circuit 23 has the first input terminal, a second input terminal, and an output terminal connected to a first input terminal of the 3-input NAND circuit 24. The input terminal Ta2 is connected to a second input terminal of the 3-input NAND circuit 24. The 3-input NAND circuit 24 has an output terminal connected to the second input terminal of the 2-input NAND circuit 23 and the output terminal Ta4. The input terminal Ta3 is connected to a third input terminal of the 3-input NAND circuit 24.

Connections of the switches 10 to 13 are described. The switches 10 and 11 have each have a first terminal connected to a first terminal of the capacitor 30 and a second terminal connected to a second terminal of the capacitor 30. The second terminal of the capacitor 30 is connected to the power supply GND. The switches 12 and 13 have each have a first terminal connected to a first terminal of the capacitor 31 and a second terminal connected to a second terminal of the capacitor 31. The second terminal of the capacitor 31 is connected to the power supply GND.

The enable signal input terminal ENINP is connected to the enable signal input terminal ENIN of the current source circuit 100, the enable signal input terminal ENIN of the current source circuit 200, and a first input terminal of the 3-input NAND circuit 22. The current source circuit 100 has the start-up signal output terminal STUP connected to a second input terminal of the 3-input NAND circuit 22. The current source circuit 200 has the start-up signal output terminal STUP connected to a third input terminal of the 3-input NAND circuit 22. The 3-input NAND circuit 22 has an output terminal connected, via a connection point P0, to the control terminal of the switch 11, the control terminal of the switch 13, and an input terminal of the inverter 20. The inverter 20 has an output terminal connected to the input terminal Ta3, the enable signal input terminal EN of the comparator circuit 300, and the enable signal input terminal EN of the comparator circuit 400.

Figure 2:
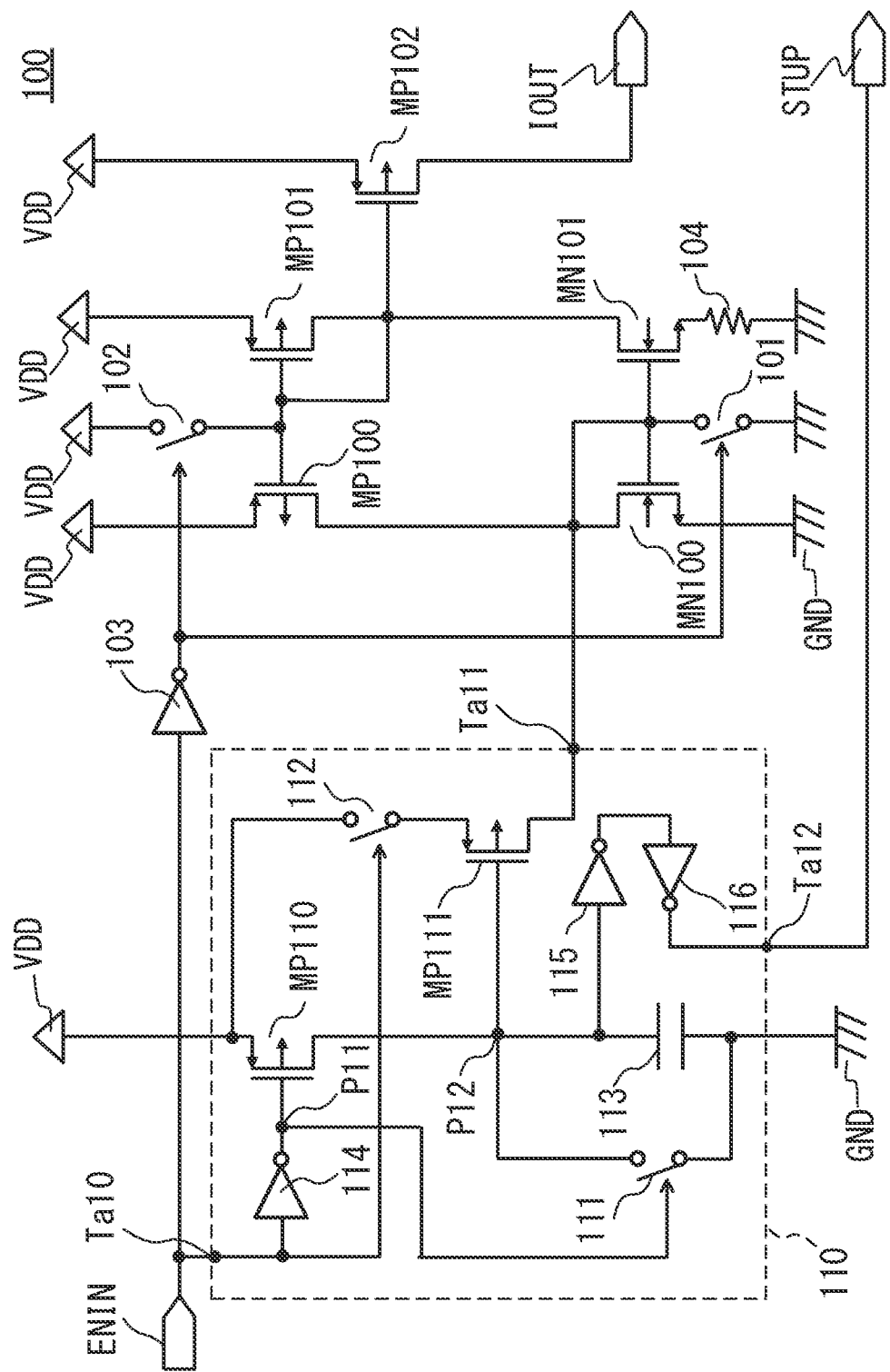
FIG. 2 is a circuit diagram of a first current source circuit in the first embodiment of the present invention.

FIG. 2 is a circuit diagram of the current source circuit 100 serving as a first current source circuit. The current source circuit 100 includes the enable signal input terminal ENIN, the output terminal IOUT, the start-up signal output terminal STUP, P-channel MOS transistors MP100, MP101, and MP102 (hereinafter each referred to as "PMOS transistor"), N-channel MOS transistors MN100 and MN101 (hereinafter each referred to as "NMOS transistor"), switches 101 and 102, an inverter 103, a resistor R104, and a start-up circuit 110. The current source circuit 100 includes a Widlar current source circuit in which the transistors MN100 and MN101 operate in a weak inversion region. For the resistor R104, a large resistance value is set so that the transistors MN100 and MN101 operate in the weak inversion region.

The switches 101 and 102 are each turned on in response to receiving a High level signal at a control terminal, and turned off in response to receiving a Low level signal at the control terminal. A correspondence relationship between an on or off state and a control signal to be supplied to each control terminal can be adjusted by inverting the signal to be input to each control terminal by e.g., the inverter.

The start-up circuit 110 includes one input terminal Ta10, two output terminals Ta11 and Ta12, PMO S transistors MP110 and MP111, inverters 114, 115, and 116, switches 111 and 112, and a capacitor 113. The switches 111 and 112 are each turned on in response to receiving a High level signal at a control terminal, and turned off in response to receiving a Low level signal at the control terminal.

Connections of the current source circuit 100 are described. The enable signal input terminal ENIN is connected to the input terminal Ta10 and an input terminal of the inverter 103. The inverter 103 has an output terminal connected to the control terminal of the switch 101 and the control terminal of the switch 102. The PMOS transistor MP100 has a source terminal connected to the power supply VDD, has a drain terminal connected to a drain terminal and gate terminal of the NMOS transistor MN100, the first output terminal Ta11, a gate terminal of the NMOS transistor MN101, and a first terminal of the switch 101, and has a gate terminal connected to a gate terminal and drain terminal of the PMOS transistor MP101, a drain terminal of the NMOS transistor MN101, a gate terminal of the PMOS transistor MP102, and a second terminal of the switch 102. The NMOS transistor MN100 has a source terminal connected to the power supply GND. The PMOS transistor MP101 has a source terminal connected to the power supply VDD. The NMOS transistor MN101 has a source terminal connected to the power supply GND via the resistor 104. The PMOS transistor MP102 has a source terminal connected to the power supply VDD and has a drain terminal connected to the output terminal LOUT. The switch 101 has a second terminal connected to the power supply GND. The switch 102 has a first terminal connected to the power supply VDD.

Connections of the start-up circuit 110 serving as a first start-up circuit are described. The start-up circuit 110 has the input terminal Ta10 connected to an input terminal of the inverter 114 and the control terminal of the switch 112. The inverter 114 has an output terminal connected to a gate terminal of the PMOS transistor MP110 and the control terminal of the switch 111 via a connection point P11. The PMOS transistor MP110 has a source terminal connected to the power supply VDD and has a drain terminal connected, via a connection point P12, to a gate terminal of the PMOS transistor MP111, an input terminal of the inverter 115, a first terminal of the capacitor 113, and a first terminal of the switch 111. The PMOS transistor MP111 has a source terminal connected to a second terminal of the switch 112 and has a drain terminal connected to the output terminal Ta11. The inverter 115 has an output terminal connected to an input terminal of the inverter 116. The inverter 116 has an output terminal connected to the start-up signal output terminal STUP via the output terminal Ta12. The capacitor 113 has a second terminal connected to the power supply GND. The switch 112 has a first terminal connected to the power supply VDD. The switch 111 has a second terminal connected to the power supply GND.

Figure 3:
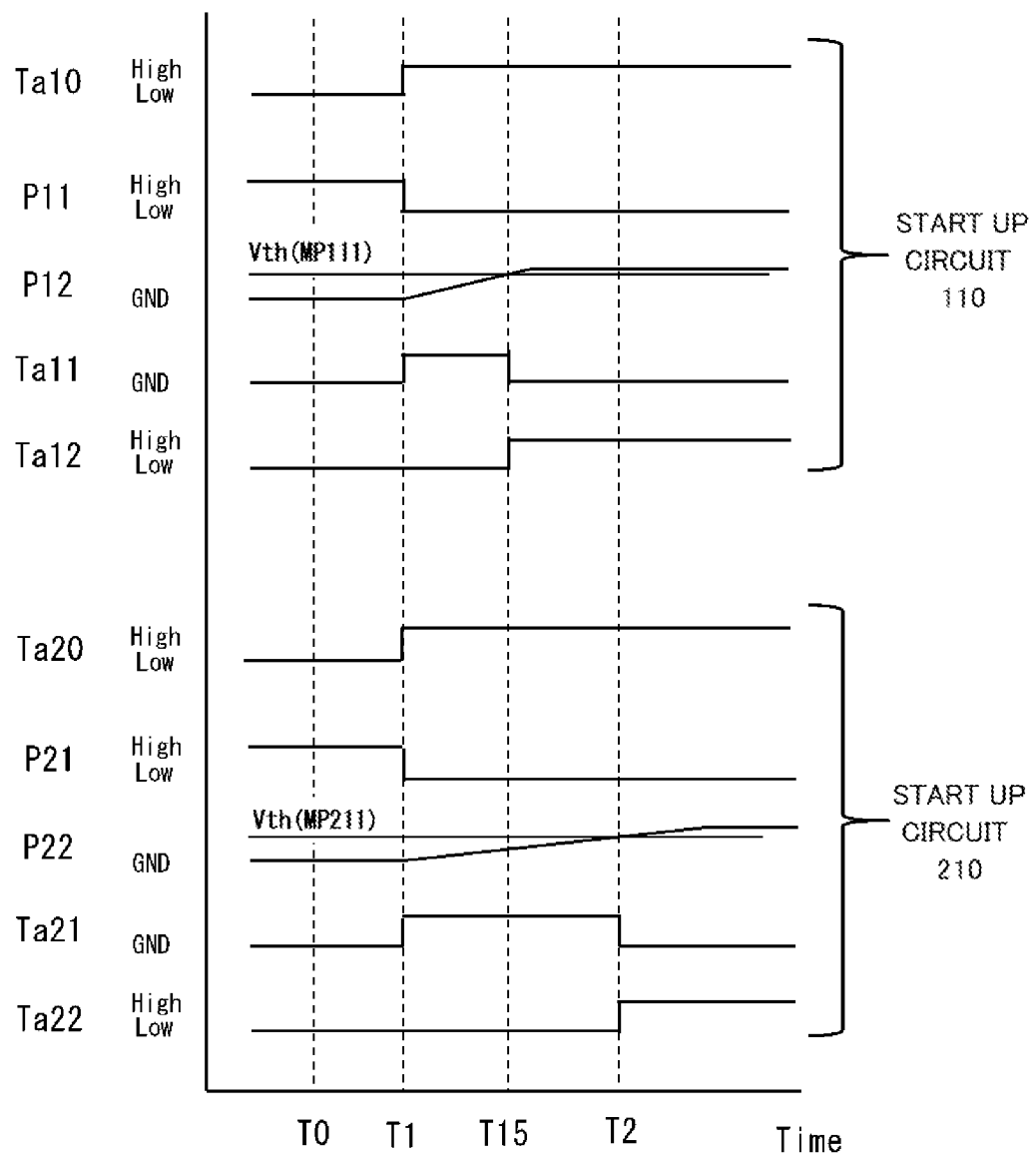
FIG. 3 is a timing chart for illustrating an operation of a start-up circuit in the first embodiment of the present invention.

FIG. 3 is a timing chart for illustrating operations of the start-up circuit 110 and a start-up circuit 210. In FIG. 3, the horizontal axis represents time, and the vertical axis represents a signal level of each section of the start-up circuit. An upper half of FIG. 3 is a timing chart for illustrating the operation of the start-up circuit 110, and a lower half of FIG. 3 is a timing chart for illustrating the operation of the start-up circuit 210.

With reference to FIG. 3, the operation of the start-up circuit 110 is described. In such a state that a Low-level signal is supplied to the input terminal Ta10 of the start-up circuit 110 (e.g., time T0 of FIG. 3), the connection point P11 turns to a High level, the switch 111 is in an on state, the switch 112 is in an off state, and the PMOS transistor MP110 is in an off state. In the on state of the switch 111, the first terminal of the switch 111 is connected to the second terminal of the switch 111. In the off state of the switch 112, the first terminal of the switch 112 is disconnected to the second terminal of the switch 112. The ends of the capacitor 113 are short-circuited by the switch 111, and thus a voltage of the connection point P12 is at a level of the power supply GND. While the PMOS transistor MP111 is in an off state, the switch 112 is in an off state, and hence a voltage of the output terminal Ta11 is at the level of the power supply GND. From the output terminal Ta12, a Low-level signal is supplied to the 3-input NAND circuit 22.

In such a state that a High-level signal is supplied to the input terminal Ta10 of the start-up circuit 110 (e.g., time T1 of FIG. 3), the connection point P11 turns to a Low level, the switch 111 is in an off state, the switch 112 in an on state, and the PMOS transistor MP110 is in an on state. The capacitor 113 is charged with a current from the PMOS transistor MP110, and the voltage of the connection point P12 is increased from the level of the power supply GND. At time T15, the voltage of the connection point P12 exceeds a threshold voltage Vth (MP111) of the PMOS transistor MP111. Before time T15, i.e., in a period where the switch 112 and the PMOS transistor MP111 each are the on state, a voltage as a start-up signal of the start-up circuit 110 is output from the first output terminal Ta11 of the start-up circuit 110. On and after time T15, the PMOS transistor MP111 is turned into an off state. In this period, the start-up signal of the start-up circuit 110 is not output from the first output terminal Ta11 of the start-up circuit 110, and a High-level signal as a start-up signal is output from the second output terminal Ta12.

Figure 4:
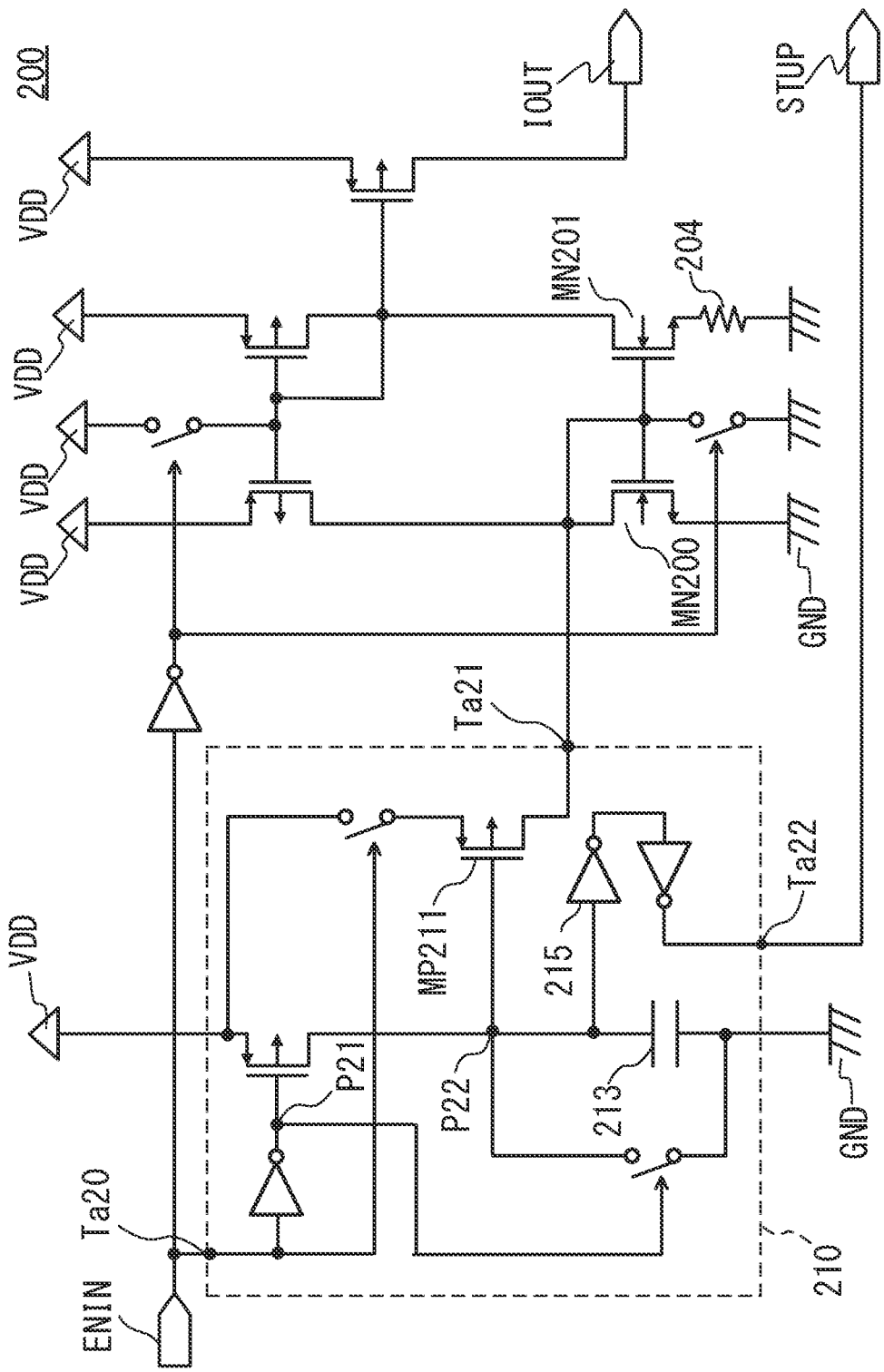
FIG. 4 is a circuit diagram of a second current source circuit in the first embodiment of the present invention.

FIG. 4 is a circuit diagram of the current source circuit 200 serving as a second current source circuit. The current source circuit 200 includes a Widlar current source circuit in which transistors MN200 and MN201 operate in a weak inversion region in the same way as in the current source circuit 100. Here, the current source circuit 200 is different from the current source circuit 100 in that the current source circuit 200 includes a start-up circuit 210 in instead of the start-up circuit 110. Although the start-up circuit 210 has the same component as that of the start-up circuit 110, a capacitance value of a capacitor 213 is different from a capacitance value of the capacitor 113. Thus, the difference from the current source circuit 100 is described, and the duplicate description thereof is omitted. The current source circuit 100 and the current source circuit 200 exhibit the same change in output current with respect to a temperature change. That is, the current source circuit 200 has a current characteristic representing the change in output current with respect to the temperature change, the current characteristic being the same current characteristic as that of the current source circuit 100. The capacitor 213 serving as a second capacitor is set to have a capacitance value larger than a capacitance value of the capacitor 113 serving as a first capacitor.

With reference to FIG. 3, an operation of the start-up circuit 210 is described. The start-up circuit 210 is the same as the start-up circuit 110 except for a capacitance value of the capacitor 213, and therefore operates in the same way as the start-up circuit 110. With the capacitor 213 being set to have a larger capacitance value than a capacitance value of the capacitor 113, a time period (from time T1 to time T2) in which the capacitor 213 is charged to exceed a threshold voltage Vth (MP211) of the PMOS transistor MP211, and then a start-up signal is output from a first output terminal Ta21, is longer than a time period (from time T1 to time T15) in which the capacitor 113 is charged to exceed a threshold voltage Vth (MP111) of the PMOS transistor MPI 11, and then the start-up signal is output from the first output terminal Ta11 of the start-up circuit 110. Further, a time period in which the resultant voltage exceeds a threshold voltage of an inverter 215 (not shown in this example) in the start-up circuit 210 and then a start-up signal at a High level is output from a second output terminal Ta22, is longer than a time period in which the resultant voltage exceeds a threshold voltage of the inverter 115 (not shown in this example) in the start-up circuit 110 and then the start-up signal at the High level is output from the second output terminal Ta12 of the start-up circuit 110.

Figure 5:
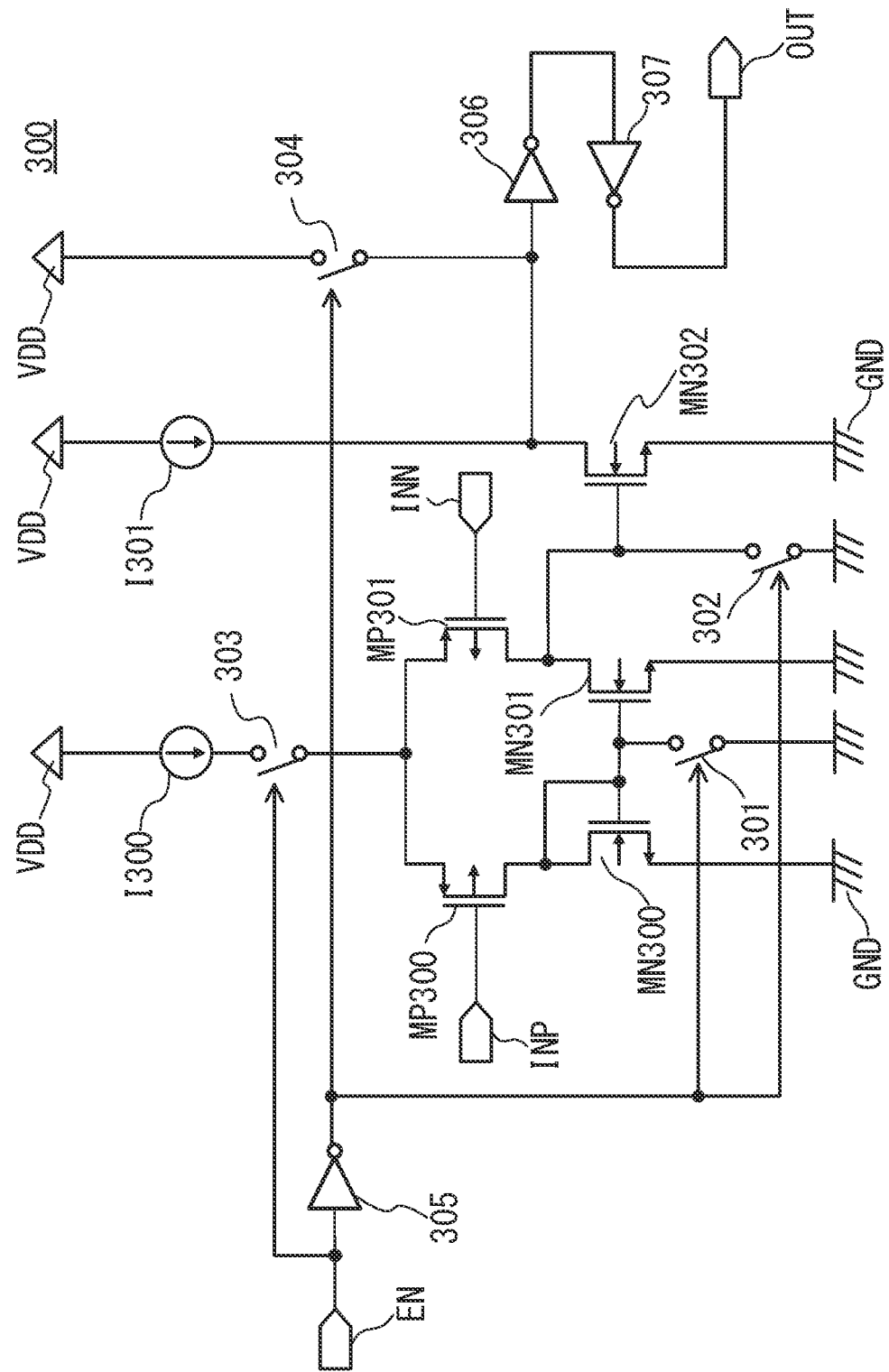
FIG. 5 is a circuit diagram of a comparator circuit in the first embodiment of the present invention.

FIG. 5 is a circuit diagram of the comparator circuit 300 serving as a first current source circuit. The comparator circuit 300 includes the non-inverting input terminal INP, the inverting input terminal INN, the enable signal input terminal EN, the output terminal OUT, PMOS transistors MP300 and MP301, NMOS transistors MN300, MN301, and MN302, inverters 305, 306, and 307, current source circuits 1300 and 1301, and switches 301, 302, 303, and 304. The switches 301 to 304 are each turned on in response to receiving a High level signal at a control terminal and turned off in response to receiving a Low level signal at the control terminal.

Connections of the comparator circuit 300 are described. The non-inverting input terminal INP is connected to a gate terminal of the PMOS transistor MP300. The inverting input terminal INN is connected to a gate terminal of the PMOS transistor MIP 301. The current source circuit 1300 has a first terminal connected to the power supply VDD, and has a second terminal connected to a first terminal of the switch 303. The switch 303 has a second terminal connected to a source terminal of the PMOS transistor MP300 and a source terminal of the PMOS transistor MP301. The PMOS transistor MP300 has a drain terminal connected to a drain terminal and gate terminal of the NMOS transistor MN300, a gate terminal of the NMOS transistor MN301, and a first terminal of the switch 301. The PMOS transistor MP301 has a drain terminal connected to a drain terminal of the NMOS transistor MN301, a gate terminal of the NMOS transistor MN302, and a first terminal of the switch 302.

The current source circuit 1301 has a first terminal connected to the power supply VDD, and has a second terminal connected to a drain terminal of the NMOS transistor 302, an input terminal of the inverter 306, and a second terminal of the switch 304. The switch 304 has a first terminal connected to the power supply VDD. The inverter 306 has an output terminal connected to an input terminal of the inverter 307. The inverter 307 has an output terminal connected to the output terminal OUT. A source terminal of the NMOS transistor MN300, a source terminal of the NMOS transistor MN301, a source terminal of the NMOS transistor MN302, a second terminal of the switch 301, and a second terminal of the switch 302 are connected to the power supply GND.

The enable signal input terminal EN is connected to the control terminal of the switch 303, and an input terminal of the inverter 305. The inverter 305 has an output terminal connected to the control terminal of the switch 301, the control terminal of the switch 302, and the control terminal of the switch 304.

The comparator circuit 300 is configured to operate as a comparator circuit which outputs, in response to receiving a Low-level signal at the enable signal input terminal EN, a High-level signal from the output terminal OUT, and outputs, in response to receiving a High-level signal at the enable signal input terminal EN, a High-level or Low-level signal from the output terminal OUT in accordance with signals supplied to the non-inverting input terminal INP and the inverting input terminal INN.

The comparator circuit 400 serving as a second comparator circuit has the same configuration as that of the comparator circuit 300, and hence description thereof is omitted.

Figure 6:
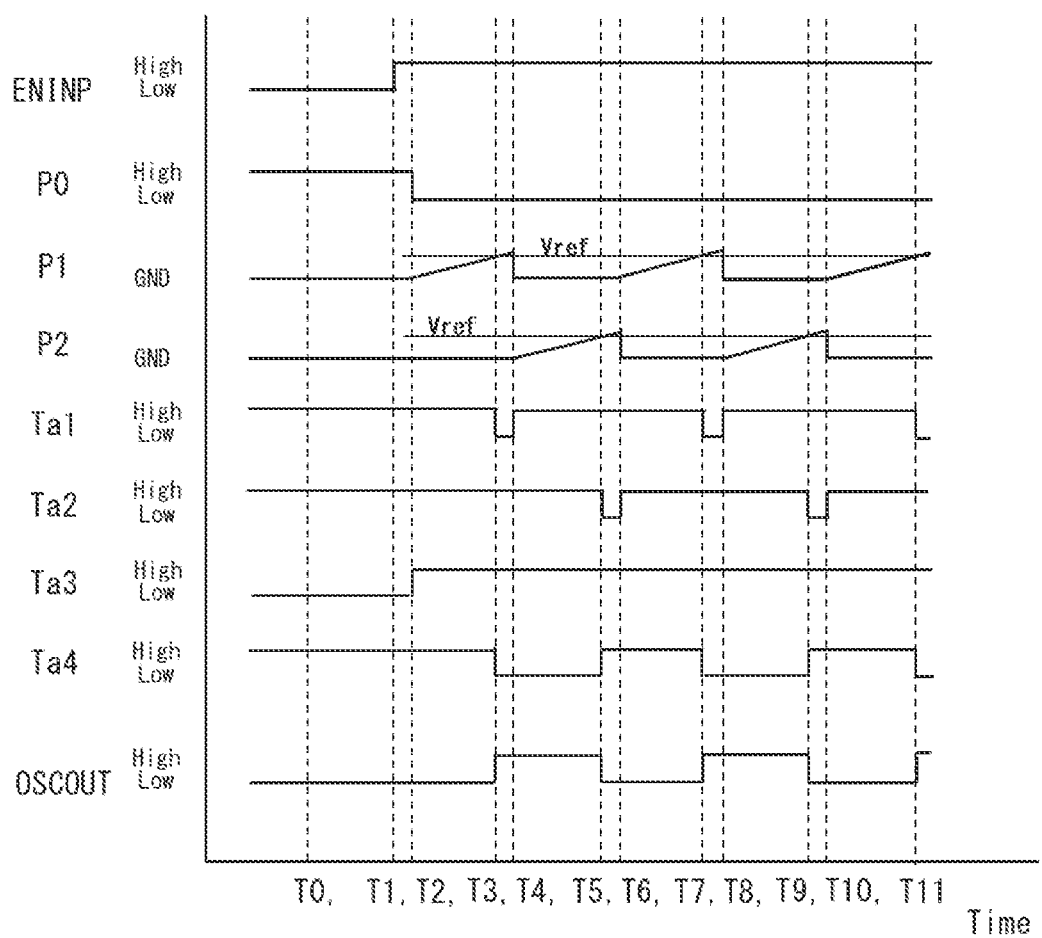
FIG. 6 is a timing chart for illustrating a whole operation of the first embodiment of the present invention.

With reference to FIGS. 1, 2, 4 and 6, an operation of the oscillation circuit of the first embodiment is described. In FIG. 6, the horizontal axis represents time, and the vertical axis represents a signal level of each signal.

Description is given of an operation performed in a state where a High-level signal is supplied to the enable signal input terminal ENINP. In this state (time T0 of FIG. 6), the current source circuits 100 and 200 each supply a Low-level signal from the start-up signal output terminal STUP to the input terminal of the 3-input NAND circuit 22. The 3-input NAND circuit 22 supplies a High-level signal from the output terminal thereof, and thus the connection point P0 turns to a High level. The switches 11 and 13 are turned on, and a Low-level signal is supplied to the enable signal input terminal EN of each of the comparator circuits 300 and 400 and the input terminal Ta3 in the RS latch 40. The comparator circuits 300 and 400 each supply a High-level signal from the output terminal OUT to each of the input terminals Ta1 and Tat in the RS latch 40.

The RS latch 40 receives the Low-level signal at the third input terminal Ta3, and thus outputs a High-level signal from the output terminal Ta4. The oscillation circuit 1 supplies a Low-level signal from the output terminal OSCOUT. The switches 12 and 14 are turned on, and the switches 13 and 15 are turned off.

Next, description is given of an operation performed in a state where a High-level signal is supplied to the enable signal input terminal ENINP. At time T1, the oscillation circuit 1 receives a High-level signal at the enable signal input terminal ENINP. The capacitance value of the capacitor 113 is smaller than the capacitance value of the capacitor 213, and hence during a time period between time T1 and time T2, first, the current source circuit 100 supplies a current from the output terminal IOUT of the current source circuit 100 and supplies a High-level signal is from the start-up signal output terminal STUP of the current source circuit 100.

The output terminal IOUT of the current source circuit 100 is connected to the power supply GND via the resistor 25, and hence a voltage appears across the resistor 25. The voltage across the resistor 25 is determined based on a current value supplied from the current source circuit 100 and a resistance value of the resistor 25 and is applied as the reference voltage Vref to the non-inverting input terminals INP of the comparator circuits 300 and 400.

The reference voltage Vref is determined based on only a size ratio between the NMOS transistor MIN100 and the NMOS transistor MN101 as long as the resistor 25 and the resistor 104 of the current source circuit 100 are made of the same material, and the reference voltage Vref has a linear proportional relationship with the temperature.

Next, in the start-up circuit 210 serving as a second start-up circuit, a voltage of a first terminal of the capacitor 213 exceeds a predetermined voltage, the current source circuit 200 supplies a current from the output terminal IOUT of the current source circuit 200 and supplies a High-level signal from the start-up signal output terminal STUP of the current source circuit 200 (time T2).

At time T2, signals supplied to the input terminals of the 3-input NAND circuit 22 are all High-level signals, and a signal of the connection point P0 is changed from the High-level signal to a Low-level signal, to thereby turn the switches 11 and 13 off. Further, the signal of the connection point P0 is inverted by the inverter 20. Signals supplied to the enable signal input terminals EN of the comparator circuits 300 and 400 are changed from the Low level to a High-level signal, to thereby supply High-level signals from the output terminals OUT of the comparator circuits 300 and 400, respectively.

In the RS latch 40, the 2-input NAND circuit 23 receives the High-level signal at the two input terminals thereof and supplies a Low-level signal from the output terminal thereof. The 3-input NANT) circuit 24 receives the Low-level signal at the first input terminal from the output terminal of the 2-input NAND circuit 23. The signal supplied from the output terminal Ta4 of the RS latch 40 keeps a High level. The signal supplied from the output terminal OSCOUT keeps outputting the Low-level signal.

Further, at time T2, with the switch 14 being turned on and the switches 10 and 11 being turned off, the capacitor 30 is charged with a current of the current source circuit 200, and a voltage of the connection point P1 starts to rise. At time T3, the voltage of the connection point P1 exceeds the reference voltage Vref, and the comparator circuit 300 changes a signal supplied from the output terminal OUT from the High level to a Low level. A signal supplied to the input terminal Ta1 of the RS latch 40 is changed from the Low level to a High level. An output signal supplied from the output terminal Ta4 of the RS latch 40 is changed from the High-level output signal to a Low-level output signal. An output signal supplied from the output terminal OSCOUT of the oscillation circuit 1 is changed from the Low-level signal to a High-level signal.

Along with such a level change of the output signal supplied from the RS latch 40, the switches 12 and 14 are turned off, and the switches 10 and 15 are turned on. At time T4, the voltage of the connection point P1 with the capacitor 30 becomes zero, and the comparator circuit 300 supplies a High-level signal to the input terminal Ta1.

At time T4, the capacitor 31 is charged with a current of the current source circuit 200, and a voltage of the connection point P2 starts to rise. At time T5, the voltage of the connection point P2 exceeds the reference voltage Vref, and the comparator circuit 400 changes a signal supplied from the output terminal OUT from the High level to a Low level. A signal supplied to the input terminal Ta2 of the RS latch 40 is changed from the High level to a Low level. An output signal supplied from the output terminal Ta4 of the RS latch 40 is changed from the Low-level output signal to a High-level output signal. An output signal supplied from the output terminal OSCOUT of the oscillation circuit 1 is changed from the High-level signal to a Low-level signal.

Along with such a level change of the output signal supplied from the RS latch 40, the switches 12 and 14 are turned on, and the switches 10 and 15 are turned off. At time T6, the voltage of the connection point P2 becomes zero, and the comparator circuit 400 supplies a High-level signal to the input terminal Ta2. The capacitor 30 is charged with a current of the current source circuit 200, and the voltage of the connection point P1 starts to rise. This state is the same as the above-mentioned state at time T2. After time T6, the oscillation circuit 1 performs an oscillation operation through repetition of from the state at time T2 to the state at time T0.

Here, the current source circuit 100 and the current source circuit 200 include Widlar current source circuits. In general, it is known that the Widlar current source circuit has two stable operating points. One of the stable operating points is a point at which an output current becomes zero, and another stable operating point is a point at which a desired output current is obtained.

In the first embodiment, in order to prevent a point at which an output current becomes zero in each of the current source circuits 100 and 200 from serving as a stable operating point, the current source circuit 100 includes the start-up circuit 110, and the current source circuit 200 includes the start-up circuit 210.

Here, the oscillation circuit 1 is so that the voltage applied to the non-inverting input terminal INP of the comparator circuit 300 or 400, i.e., the reference voltage Vref is higher than a voltage of the inverting input terminal INN of the comparator circuit 300 or 400 before the oscillation circuit 1 starts oscillating. That is, the current source circuit 100 is activated before the current source circuit 200 is activated. If the current source circuit 200 is activated before the current source circuit 100 is activated, a voltage applied to the inverting input terminal INN of the comparator circuit 300, i.e., the voltage at the connection point P1 does not exceed the reference voltage Vref applied to the non-inverting input terminal INP of the comparator circuit 300 during time T2 to time T4. In this case, a voltage of the output terminal OUT of the comparator circuit 300 or 400 remains at a High level. The voltage of the output terminal OUT of the comparator circuit 300 or 400 is not inverted, and hence the oscillation operation is not started.

In the first embodiment, the capacitor 213 of the start-up circuit 210 is set to have a larger capacitance value than a capacitance value of the capacitor 113 of the start-up circuit 110 so that the current source circuit 100 is activated before the activation of the current source circuit 200 in order to reliably start the oscillation operation.

According to the oscillation circuit of the first embodiment, it is possible to obtain the oscillation circuit having a small circuit scale and low power consumption.

Second Embodiment

An oscillation circuit according to a second embodiment of the present invention includes the same components as those of the oscillation circuit according to the first embodiment of the present invention except for current source circuits serving as the first and the second current source circuits. In this embodiment, these current source circuits as a difference from the oscillation circuit of the first embodiment is described, and duplicate description is omitted.

Figure 7:
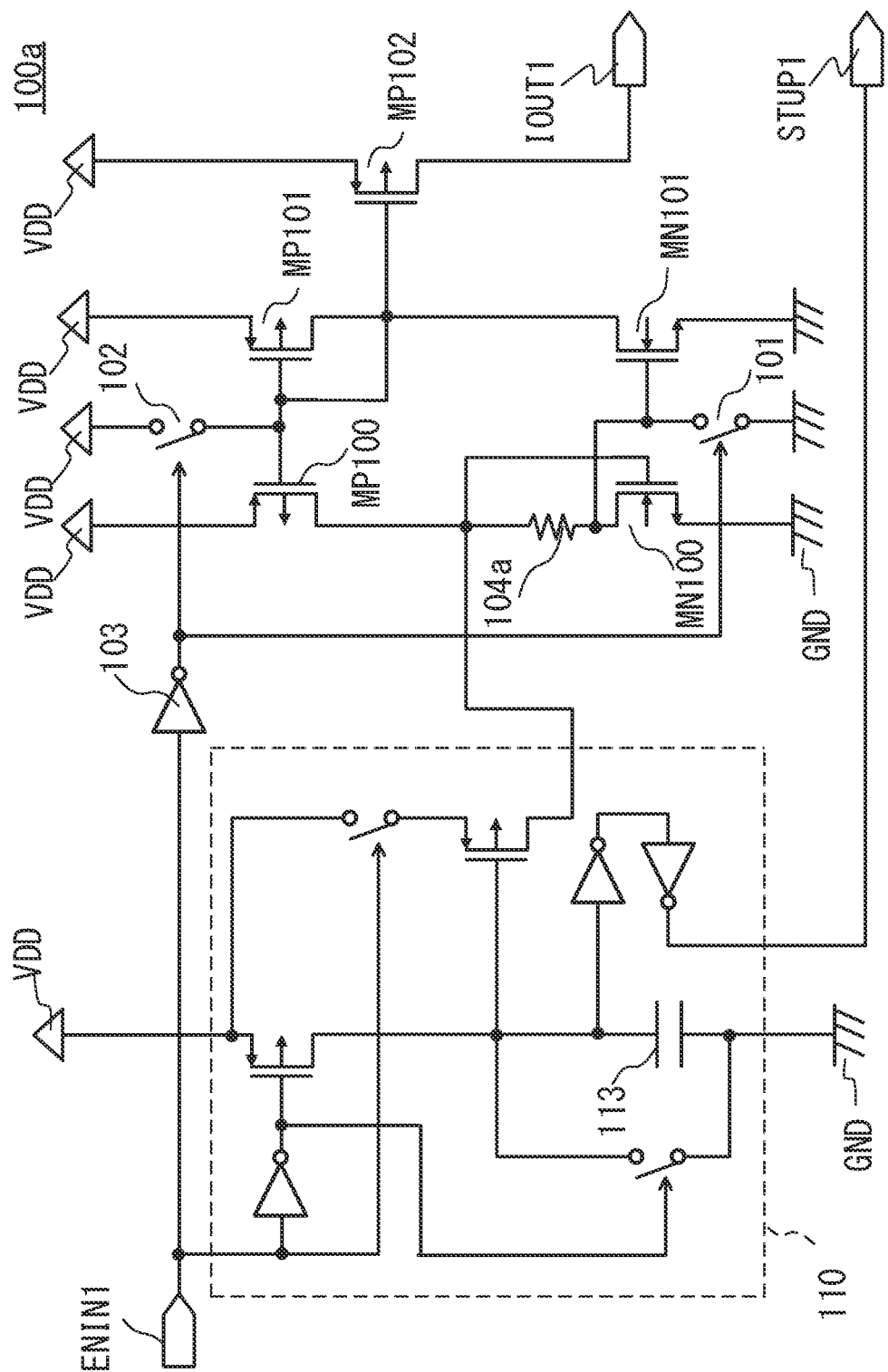
FIG. 7 is a circuit diagram of a first current source circuit in a second embodiment of the present invention.
Figure 8:
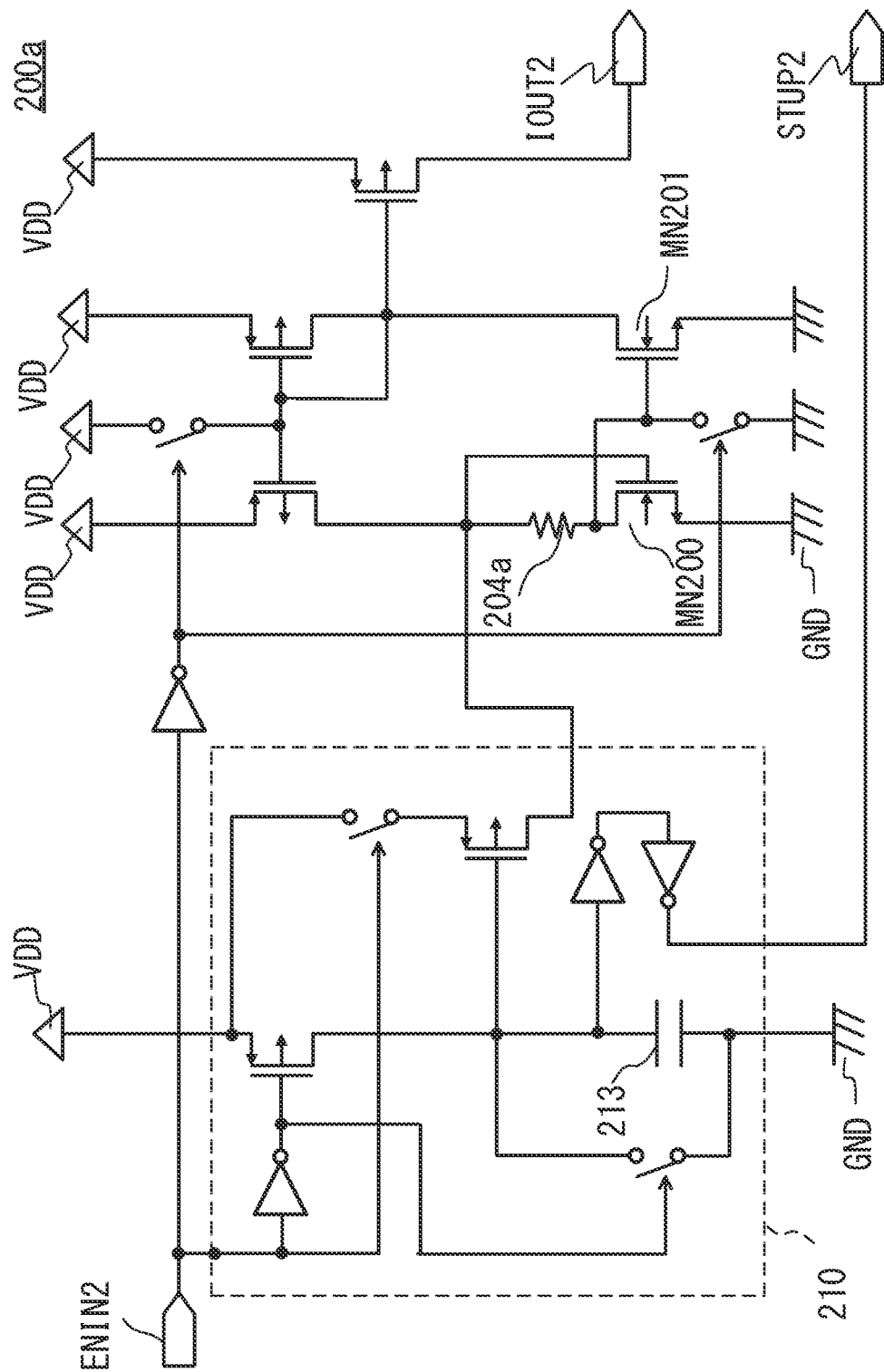
FIG. 8 is a circuit diagram of a second current source circuit in the second embodiment of the present invention.
Figure 9:
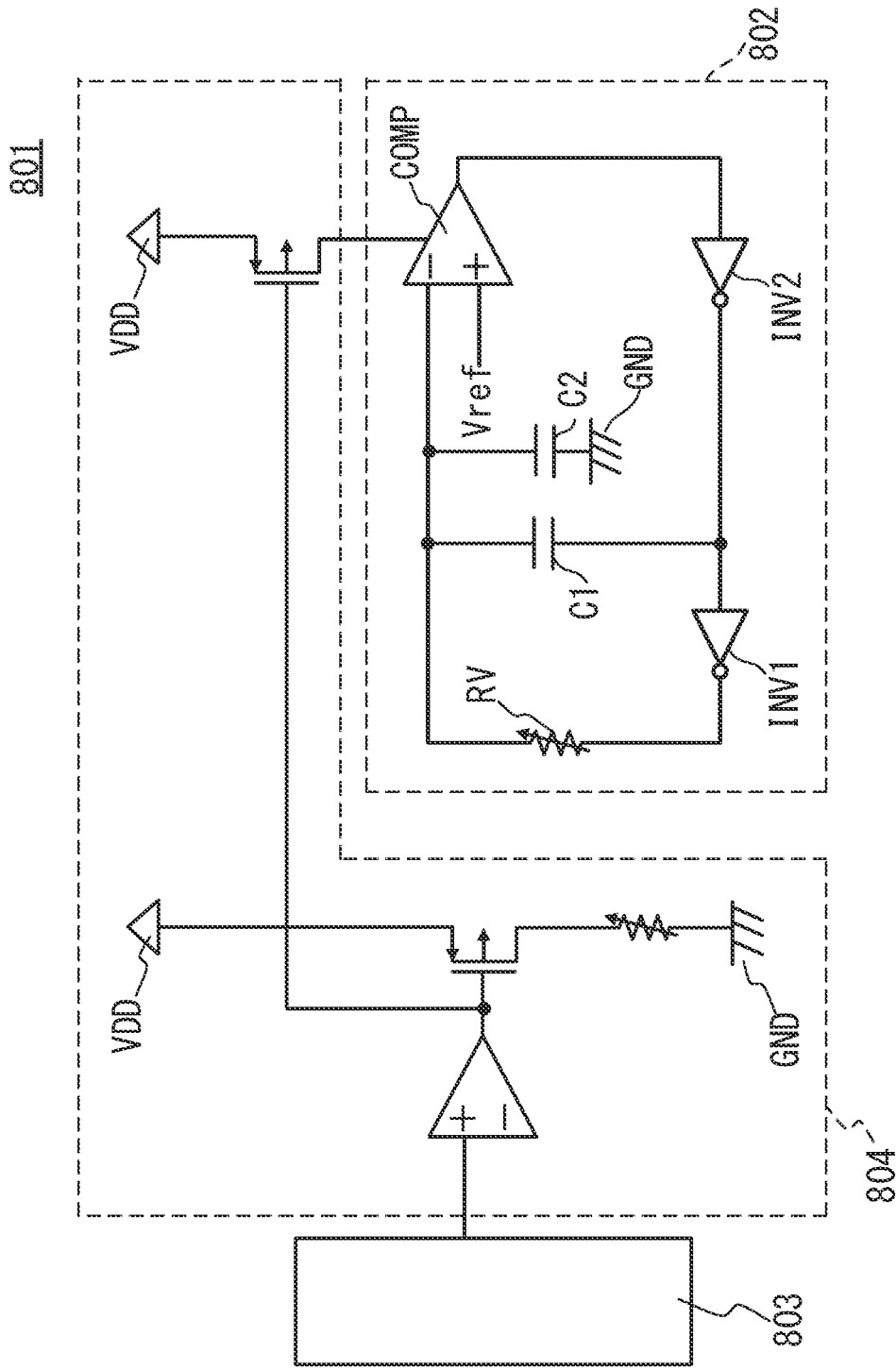
FIG. 9 is a circuit diagram of a conventional oscillation circuit.

FIG. 7 is a circuit diagram of a current source circuit 100a as the first current source circuit. FIG. 8 is a circuit diagram of a current source circuit 200a as the second current source circuit. The current source circuit 100a is an example of the oscillation circuit according to the second embodiment and corresponds to the current source circuit 100 in the first embodiment. The current source circuit 200a is another example of the oscillation circuit according to the second embodiment and corresponds to the current source circuit 200 in the first embodiment.

A difference between the current source circuit 100a and the current source circuit 100 is that a resistor 104a is connected between the drain terminal and the gate terminal of the NMOS transistor MN100, and the gate terminal of the NMOS transistor MN101 is connected to the drain terminal of the NMOS transistor MN100 and the gate terminal of the NMOS transistor MN100 via the resistor 104a. The current source circuit 100a is configured as with the current source circuit 100 except for the difference.

A current generated by the current source circuit 100 is influenced by a substrate bias effect of the NMOS transistor MN101 for the following reason. That is, with the resistor 104 being provided between the source terminal of the NMOS transistor MN101 and the power supply GND, a current flowing through the resistor 101 causes a back gate voltage to be lower than a voltage of the source terminal. The threshold voltage Vth is not completely the same between the NMOS transistor MN100 and the NMOS transistor MN101 because of an influence of the substrate bias effect in the NMOS transistor MN101.

The current source circuit 100a has a configuration that causes no substrate bias effect in the NMOS transistor MN101 because of no resistor connected between the source terminal of the NMOS transistor MN101 and the power supply GND, and threshold voltages of the NMOS transistor MN100 and the NMOS transistor MN101 can be therefore canceled. It can be expected to reduce an influence of temperature on the oscillation circuit of the second embodiment.

A difference between the current source circuit 200a and the current source circuit 100a is the same as the difference between the current source circuit 200 and the current source circuit 100, and hence description thereof is omitted. According to the oscillation circuit of the present embodiment, the oscillation circuit of the present embodiment includes the current source circuit 100a having the configuration that causes no substrate bias effect in the NMOS transistor MN101 and the current source circuit 200a having the configuration that causes no substrate bias effect in the NMOS transistor MN201, and hence the influence of temperature on the oscillation circuit of the present embodiment can be reduced.

As described above, according to the oscillation circuit of the second embodiment, it is possible to obtain the oscillation circuit having a small circuit scale and low power consumption. Hereinabove, although the embodiments of the present invention have been described in detail with reference to the drawings, specific structures of the present invention are not limited to those embodiments and encompass designs and the like without departing from the gist of the present invention. Incidentally, each switch described in the at least one embodiment may be configured by a PMOS transistor or an NMOS transistor.

What is claimed is:

1. An oscillation circuit, comprising:
   a first current source circuit having a power supply terminal to be connected to a first power source and an output terminal;
   a second current source circuit having a power supply terminal to be connected to the first power source and an output terminal;
   a resistor between the output terminal of the first current source circuit and a second power source;
   a first capacitor;
   a second capacitor;
   a first comparator circuit having a first input terminal to which is a voltage across the resistor is applied as a reference voltage and a second input terminal to which a voltage of the first capacitor is applied;
   a second comparator circuit having a first input terminal to which is the reference voltage is applied and a second input terminal to which a voltage of the second capacitor is applied;
   an RS latch configured to receive a first output signal supplied from the first comparator circuit and a second output signal supplied from the second comparator circuit, and output signal at a High level or a Low level;
   a first switch is configured to connect or disconnect a current path between the second current source circuit and the first capacitor in accordance with a signal level of the output signal of the RS latch;
   a second switch is configured to disconnect or connect a current path between the second current source circuit and the second capacitor in accordance with the signal level of the output signal of the RS latch; and
   an enable signal input terminal configured to receive an enable signal;
   wherein the first current source circuit includes an enable signal input terminal and a first start-up circuit, the enable signal input terminal of the first current source connected to the enable signal input terminal of the oscillation circuit and configured to receive the enable signal,
   wherein the second current source circuit includes an enable signal input terminal and a second start-up circuit, the enable signal input terminal of the second current source connected to the enable signal input terminal of the oscillation circuit and configured to receive the enable signal; and
   wherein the first start-up circuit is configured to output a first start-up signal before the second start-up circuit outputs a second start-up signal.

2. The oscillation circuit according to claim 1, wherein the first current source circuit has a current characteristic representing a change in output current with respect to a temperature change, and
   wherein the second current source circuit has the current characteristic.

3. The oscillation circuit according to claim 2, wherein the first current source circuit and the second current source circuit each include a Widlar current source including transistors configured to operate in a weak inversion region.

4. The oscillation circuit according to claim 1, wherein the first current source circuit is configured to output the first start-up signal in a first amount of time following receipt of the enable signal,
   wherein the second current source circuit is configured to output the second start-up signal in a second amount of time following receipt of the enable signal, and
   wherein the first amount of time is less than the second amount of time.

5. The oscillation circuit according to claim 4, wherein the first current source circuit and the second current source circuit each include a Widlar current source including transistors configured to operate in a weak inversion region.

6. The oscillation circuit according to claim 1, wherein the first start-up circuit of the first current source circuit comprises a first capacitor,
   wherein the second start-up circuit of the second current source circuit comprises a second capacitor, and
   wherein the second capacitor has a first capacitance value larger than a second capacitance value of the second capacitor.

7. The oscillation circuit according to claim 6, wherein the first current source circuit and the second current source circuit each include a Widlar current source including transistors configured to operate in a weak inversion region.

8. The oscillation circuit according to claim 1, wherein the first current source circuit and the second current source circuit each include a Widlar current source including transistors configured to operate in a weak inversion region.

* * * * *